United States Patent [19]
Sekine et al.

[11] Patent Number: 4,786,361
[45] Date of Patent: Nov. 22, 1988

[54] DRY ETCHING PROCESS

[75] Inventors: Makoto Sekine, Yokohama; Haruo Okano; Yasuhiro Horiike, both of Tokyo, Japan

[73] Assignee: Kabushiki Kaisha Toshiba, Kawasaki, Japan

[21] Appl. No.: 22,368

[22] Filed: Mar. 5, 1987

[30] Foreign Application Priority Data

Mar. 5, 1986 [JP] Japan .................. 61-47709
Mar. 28, 1986 [JP] Japan .................. 61-68666
Aug. 29, 1986 [JP] Japan .................. 61-201559

[51] Int. Cl.$^4$ .............................................. B44C 1/22
[52] U.S. Cl. .................................... 156/643; 156/646; 156/662; 156/664; 156/345; 427/47; 204/192.32; 204/298
[58] Field of Search .............. 156/643, 646, 345, 662, 156/664; 204/192.32, 298; 427/47

[56] References Cited

U.S. PATENT DOCUMENTS

| | | | |
|---|---|---|---|
| 4,222,838 | 9/1980 | Bhagat et al. | 204/192.37 |
| 4,331,486 | 5/1982 | Chenevas-Paule et al. | 427/35 |
| 4,399,014 | 8/1983 | Engle | 156/643 |
| 4,464,223 | 8/1984 | Gorin | 156/643 |
| 4,522,844 | 6/1985 | Khanna et al. | 427/47 |
| 4,600,492 | 7/1986 | Ooshio et al. | 204/192.32 |
| 4,631,106 | 12/1986 | Nakazato et al. | 156/643 |
| 4,632,718 | 12/1986 | Chow et al. | 156/345 |
| 4,654,118 | 3/1987 | Staples | 156/643 |
| 4,668,337 | 5/1987 | Sekine et al. | 156/643 |
| 4,668,338 | 5/1987 | Maydan et al. | 156/643 |
| 4,668,365 | 5/1987 | Foster et al. | 156/643 |

FOREIGN PATENT DOCUMENTS

| | | | |
|---|---|---|---|
| 0130530 | 8/1983 | Japan | 204/298 |
| 2060867 | 3/1987 | Japan | 204/298 |
| 2070569 | 4/1987 | Japan | 204/298 |
| 2072121 | 4/1987 | Japan | 204/298 |

OTHER PUBLICATIONS

J. Vac. Sci. Technol. B3, 16, 1985; Pattern profile control of polysilicon plasma etching; M. Kimizuka and K. Hirata Proceedings of the Symposium on Dry Process, Tokyo; Oct. 1982, Characteristics of SiO$_2$ Reactive Sputter Etching Using Magnetic Field; Kado Hirobe et al.

Primary Examiner—David L. Lacey
Assistant Examiner—Lori-Ann Johnson
Attorney, Agent, or Firm—Oblon, Fisher, Spivak, McClelland, & Maier

[57] ABSTRACT

A process is disclosed which etches a workpiece, with an etching mask of a predetermined pattern formed on the surface of the workpiece, on an apparatus which includes a container for holding first and second electrodes opposite to each other and a magnetic field generator arranged on a side opposite to that side of the second electrode where the second electrode faces the first electrode, which comprises placing the workpiece on the first electrode, supplying a feed gas into the container, evacuating air in the container to set pressure in the container at a level of $10^{-2}$ torrs, and applying high frequency power across the first and second electrodes to yield plasma whereby the workpiece is etched.

16 Claims, 8 Drawing Sheets

F I G. 5
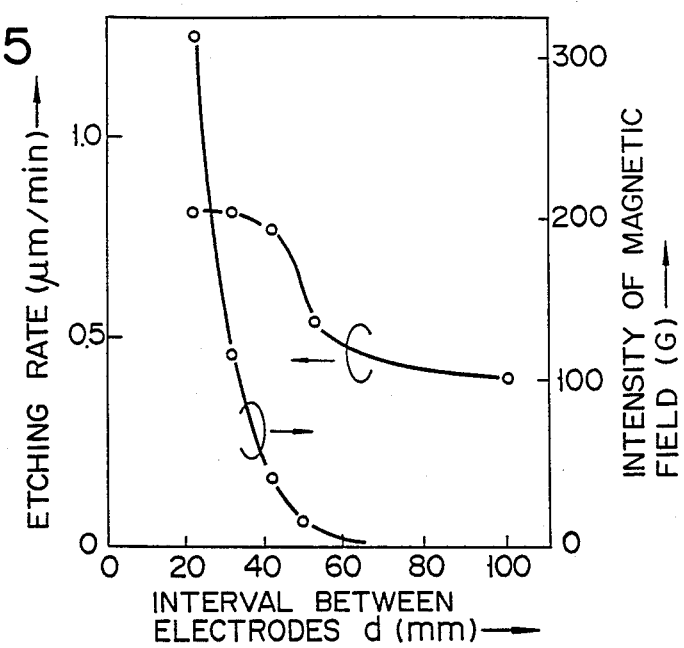
F I G. 6
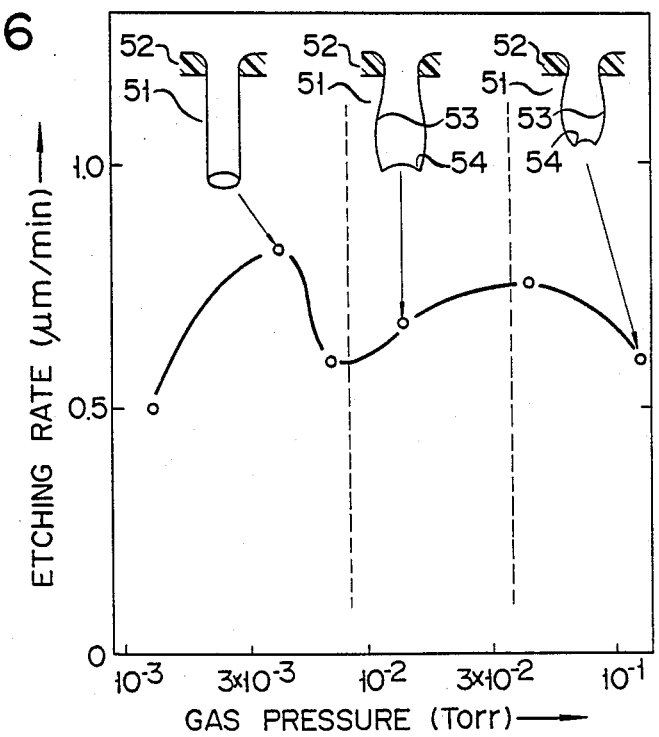

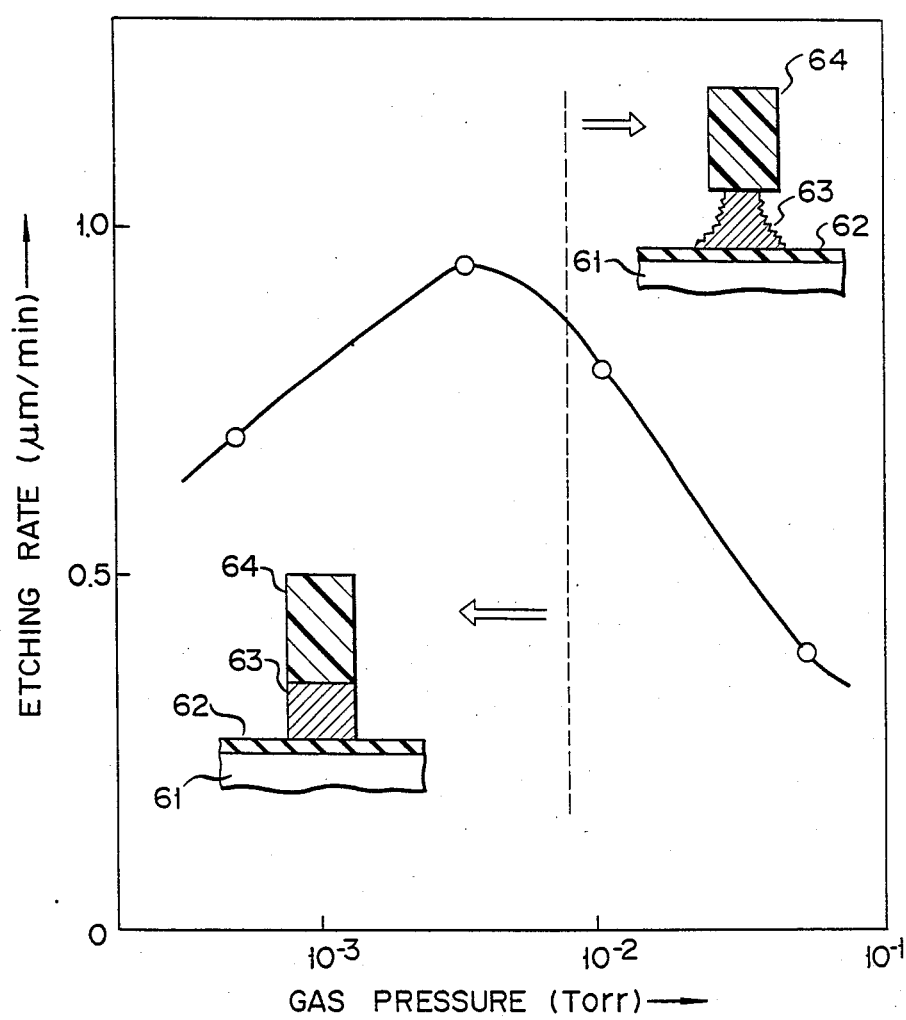
F I G. 7

DRY ETCHING PROCESS

BACKGROUND OF THE INVENTION

1. Field of the Invention

This invention relates to a dry etching process and, in particular, to a dry etching process utilizing a magnetron discharge.

2. Description of the Prior Art

Recently, a reactive ion etching technique has primarily been used in a fine patterning for the fabrication of a high density device. The reactive ion etching technique comprises introducing a gas containing halogen atoms, such as $CF_4$, into a chamber holding a substrate placed on one of a pair of oppositely facing electrodes, applying high frequency power across the pair of electrodes to discharge that gas, and etching the substrate through the utilization of ions and radicals produced due to the discharge.

As an etching apparatus for performing such an etching process, two types of apparatus are known:

(1) a batch-wafer apparatus for etching, for example, 10 to 20 substrates at a time within a large-sized chamber and (2) a single-wafer apparatus for etching only one substrate within a small-sized chamber. LSI patterns will become more and more micro-miniaturized in the future and, furthermore, the silicon wafer diameters will also been more and more enlarged in the future, as in an 8-, 12-inch ... size. In order for a very fine pattern to be uniformly formed on the surface of the greater-sized wafer, the single-wafer apparatus has been found advantageous over the batch-wafer apparatus and thus has largely been employed as such. Under the identical etching-rate conditions, however, the single-wafer apparatus is lower in processing capability than the batch-wafer apparatus. In the single-wafer apparatus, an ingenious design has been made to enhance the discharge efficiency, such as to utilize magnetron discharge under a magnetic field.

The conventional dry etching apparatus utilizing the magnetron discharge is shown in FIG. 1. In the arrangement shown in FIG. 1, reference numeral 11 shows a vacuum chamber; 12, a cathode; 13, a sample; 14, a matching circuit; 15, a high frequency power source; 16, a magnetic field generator having a plurality of magnet bars 16a arranged in an order of N, S, N and S; 17, a driving mechanism for moving magnetic field generator 16 in a direction parallel to cathode 12; 18 and 19, a gas inlet and gas outlet, respectively; and 20, an insulator. In this apparatus, electrons are cycloidally moved at a perpendicular intersection area of a magnetic field generated at magnetic field generator 16 and an electric field crossing an ion sheath created in the neighborhood of the surface of cathode 12. As a result, a dense plasma is created at that location and the sample is etched at a high rate due to the ions in the resultant plasma. The reciprocating movement of magnetic field generator 16 assures a uniform formation of the plasma and thus a uniform etching of sample 13.

The apparatus as shown in FIG. 1, however, has encountered the following problems.

As shown in FIG. 2A, dense plasma region 21 over a clearance between magnet bars 16a creates a space potential difference relative to the other region, resulting in bending the ions in their moving direction which are to be incident vertically on the sample. However, the bending of the ions never occurs in a direction orthogonal to the moving (scanning) direction of the magnetic field. As shown in FIG. 2B, the unmasked portion of sample 23 other than mask 22 is vertically etched in the direction parallel to the scanning direction of the magnetic field. As shown in FIG. 2C, however, "undercutting" occurs in a direction perpendicular to the scanning direction of the magnetic field. That is, the pattern configuration or profile differs depending on directions.

Even in the ordinary reactive ion etching never utilizing the magnetron discharge, if an aluminum film, for example, is etched by chlorine series reactive ions, a side etching occurs due to a violent reactivity of the activated chlorine. It is, therefore, difficult to make an etching at a desired side wall angle. Recently, a strong demand has been made for the technique of forming a groove of a greater aspect ratio (etching depth/pattern width ratio), i.e., the ratio of the etching depth to the pattern width, in the manufacturing process of the semiconductor device.

SUMMARY OF THE INVENTION

A primary object of this invention is to provide a dry etching process which can uniformly etch a workpiece in a manner free from any undercutting to obtain a uniform pattern profile in all directions.

Another object of this invention is to provide a dry etching process which can form a groove of a greater aspect ratio.

Another object of this invention is to provide a dry etching process which can form a side wall on a workpiece at any proper angle of slope.

The dry etching process of this invention is provided which etches a workpiece, with an etching mask of a predetermined pattern formed on the surface of the workpiece, with use of an apparatus including a container for holding first and second electrodes opposite to each other and magnetic field generator arranged on a side opposite to that side of the second electrode where the second electrode oppositely faces the first electrode, the magnetic field generator applying a magnetic field across the first and second electrodes, which comprises the steps of placing the workpiece on the first electrode, supplying a feed gas into the container, evacuating air in the container to set pressure in the container at a level of less than $10^{-2}$ torrs, and applying high frequency power across the first and second electrodes to yield plasma whereby the workpiece is etched.

In the process of this invention the pressure in the container is set at a level of less than $10^{-2}$ torrs, the result of which is as follows.

At the pressure level exceeding $10^{-2}$ torrs, more neutral particles of no directional property are produced in the plasma created due to discharge and, with the resultant shorter mean free path, more ions collide with each other so that more ions slantly collide against the surface of the workpiece to produce undercutting. In order to form a groove of a greater aspect ratio it is preferable that the pressure in the container be made at a level of below $8 \times 10^{-3}$ torrs. It is also preferable that the pressure in the container be made at a level of above $2 \times 10^{-4}$ torrs.

If the etching or deposition gas is employed as a feed gas, it is possible to obtain what is called a sloped wall etching. In this case, the angle of slope can be controlled by controlling an amount of deposition gas. In order to obtain such a sloped wall etching at a high etching rate, the pressure in the container is made at a level of preferably over $2\times10^{-4}$ torrs and more preferably $3\times10^{-3}$ to $8\times10^{-3}$ torrs.

As the material of the workpiece to be etched, use may be made of a semiconductor material, such as Si, Ge or GaAs; an Al series metal, such as Al or Al alloy; an insulation, such as $SiO_2$; a metal silicide, such as $MoSi_2$; and an organic material, such as photoresist. The etching gas and deposition gas can properly be selected in accordance with the material of which the workpiece is made. As the etching gas use can be made of a halogen gas, such as $Cl_2$ or $F_2$, or $CHF_3$ or a mixture of $CH_4$ and $H_2$. As the deposition gas use can be made of $CHCl_3$ or $CHF_3$.

BRIEF DESCRIPTION OF THE DRAWINGS

FIG. 5 is a graph showing a variation of an etching rate and magnetic intensity with respect to an electrode separation in a process of this invention;

FIG. 6 is a graph showing a variation of the etching rate and pattern profile with respect to a gas pressure in a process of etching a Si film by a $Cl_2$ gas;

FIG. 7 is a graph showing a variation of an etching rate and pattern profile with respect to a gas pressure in a process of etching an aluminum film by a $Cl_2$ gas;

DETAILED DESCRIPTION OF THE PREFERRED EMBODIMENTS

According to this invention, a workpiece is placed on an electrode (a cathode) which is located remote from a magnetic field generator and supplied with high frequency power. In a container whose internal pressure is set at a relatively low level, an ion sheath created in the neighborhood of the cathode extends in a predetermined direction so that its direct-current electric field overlaps with a magnetic field area. As a result, magnetron discharge occurs at an area where the direct-current electric field of the sheath intersects the magnetic field at an angle perpendicular to each other. In this way, a dense plasma is yielded to allow the workpiece to be etched at a high etching rate.

Since the magnetic field generator is located remote from the cathode, a magnetic field never exists in a zone from the magnetron discharge region to the workpiece, as distinct from the conventional case where the magnetic field generator is located beneath the cathode. As a result, the motion of the ions is not affected by the magnetic field. Due to a self-bias of the resultant ion sheath which is greater than in the conventional method, a greater energy of the ions is involved, thus being less liable to be influenced by a potential difference between the magnetron discharge area and the ordinary discharge region. Thus the pattern profile never differs in the vertical direction and in the direction parallel to the scanning direction of the magnetic field.

Furthermore, due to the smaller internal pressure in the container and the consequent less neutral particles in the plasma and longer mean free path, neutral particles and ions are much less liable to be incident onto the workpiece from the slant direction, thus preventing a side etching.

The preferred embodiment of this invention will now be explained below with reference to the accompanying drawings.

Figure 3:
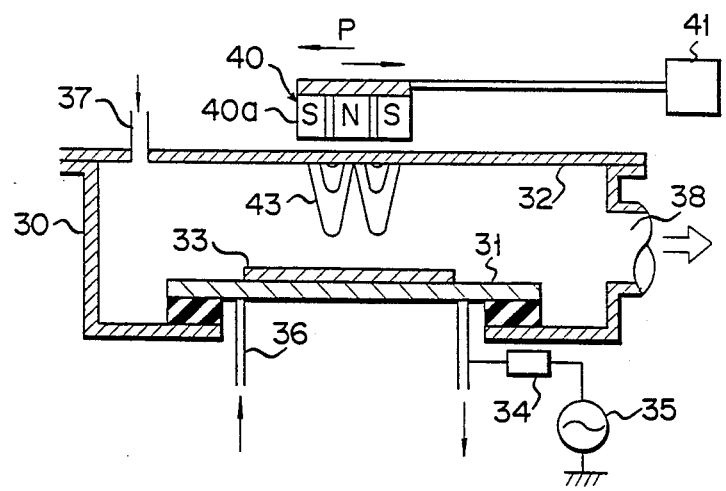
FIG. 3 is a view generally showing a dry etching apparatus according to one embodiment of this invention.

FIG. 3 is a diagrammatic view showing a dry etching apparatus for use in the dry etching process of this invention.

In the apparatus shown in FIG. 3, first and second electrodes 31 and 32 are located within vacuum container 30 in a mutually opposite fashion. A sample (workpiece) is disposed on the upper surface of first electrode (cathode) 31 and high frequency power is applied to electrode 31 through matching circuit 34. First electrode 31 is cooled by cooling mechanism 36.

Second electrode (anode) 32 facing first electrode 31 is constituted by an upper wall of container 30 and grounded. Here a quartz plate, not shown, is attached to the lower surface of second electrode 32. Since high density plasma is formed, by the magnetron discharge, at the narrower interelectrode zone, sputtering may sometimes occur at electrode 32 at which time the substrate 33 may be contaminated since electrode 32 is exposed. An insulation made of ceramics material, such as alumina, may be covered on the lower surface of second electrode 32 in place of the quartz plate. Depending upon a feed gas employed, use may be made, as a covering material, of an organic film, such as polyimide film or Mylar film, or a carbon sheet. Here a distance d between first and second electrodes 31 and 32 is set to be, for example, 30 mm.

A halogen gas, such as $Cl_2$, or a deposition gas, such as chloroform, is introduced into vacuum container 30 through gas inlet 37, noting that gas in container 30 is exhausted from gas outlet 38. A turbo type molecular pump is used to exhaust the gas in container 30 at a relatively high flow rate of 20 cc/min and a vacuum level of about $1\times10^{-3}$ torrs.

Outside the container 30, magnetic field generator 40 is located over the upper surface of second electrode 32 in close proximity and comprised of permanent magnet 40a of an NSNS array. Through second electrode 32, magnetic field generator 40 creates a predetermined magnetic field between first and second electrodes 31 and 32 and is reciprocably moved, by moving mechanism 41, along second electrode 32 in the directions indicated by arrows P in FIG. 3. Reference numeral 43 in FIG. 3 shows a magnetic pattern of a magnetic field which is yielded by magnetic field generator 40.

In this arrangement, a predetermined gas is fed into container 30 with internal pressure in container 30 set at a predetermined level, and high frequency power is applied across first and second electrodes 31 and 32. By reciprocably moving magnetic field generator 40 high density, uniform plasma can be created over substrate 33. It is, therefore, possible to uniformly etch substrate 33 at high speed.

Experiments have been conducted on the aforementioned apparatus, the result of which is shown below. A desirable etching process will be explained below on the basis of the result of the experiments.

Figure 4:
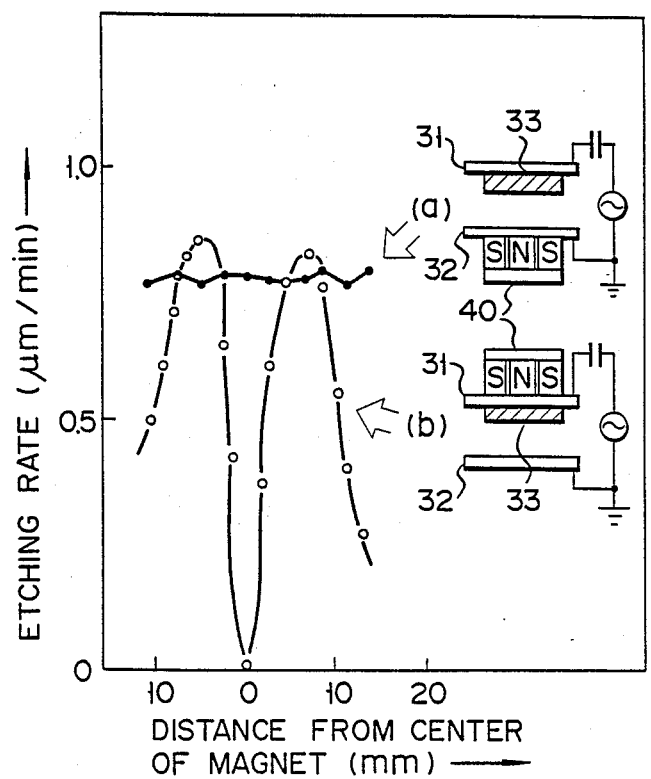
FIG. 4 is a graph showing a variation of an etching rate relative to a distance from the center of a magnet in a conventional process and the process of this invention.

FIG. 4 is a graph showing a distribution over a wafer (sample 33) obtained with respect to a distance from the center of magnetic field generator 40 at an etching rate obtained with magnetic field generator 40 stopped, noting that magnetic field generator 40 is located on the near surface of cathode 31 as in the prior art and on the rear surface of anode 32 as in this invention. As an etching gas, as $Cl_2$ was introduced at a flow rate of 20 (cc/min) into container 30 with a (100) face orientation substrate (a single crystalline Si wafer) of a resistivity of 6 to 8 located therein to maintain internal gas pressure in chamber 30 at a level of $5 \times 10^{-3}$ torrs in which case the density of the high frequency power was 1 [W/cm2]. As evident from this graph, the etching rate is prominently increased at an area of the magnetic pole gap, as indicated by open circles (the prior art) in FIG. 4, where a high density plasma is created, in which case the etching rate is decreased over the magnetic pole. A somewhat higher uniformity can be obtained through the scanning of magnetic field generator 40, but a high uniformity cannot be expected in the prior art mentioned. According to this invention, due to a remote distance between the magnet and the wafer, high density plasma is created, by the aforementioned magnetic field, over a wider range from near the anode toward the cathode. As indicated by solid circles in FIG. 4, uniform, high-speed etching can be achieved with magnetic field generator 40 stopped. The same result was also obtained even if use was made of a deposition gas containing, in addition to $Cl_2$, chloroform. In the actual apparatus, an even higher uniformity can be implemented through the scanning of magnetic field generator 40.

FIG. 5 shows a variation of a magnetic flux density over the wafer at an etching rate obtained when an interelectrode distance d varies. In this case, magnetic field generator 40 was located on the reverse surface f anode 32 with a wafer disposed on cathode 31 and at that time the etching rate was decreased at d=40 to 60 [mm], but appreciably never be decreased at a subsequent time. Considering this in terms of the magnetic flux density over the wafer, 100 to 200 [G] may be sufficient. At d=10 [mm] or lower, the same phenomenon as encountered in the prior art arises. From computation it has been found that at d=40 [mm] or above the etching rate is lowered, but that a magnetic field of 150 G is obtained about 100 [mm] from the magnet surface by improving the configuration of the magnet. It is, therefore, preferable that the magnetic density over the wafer is 100 to 300 [G] at d=10 to 100 [mm].

Figure 1:
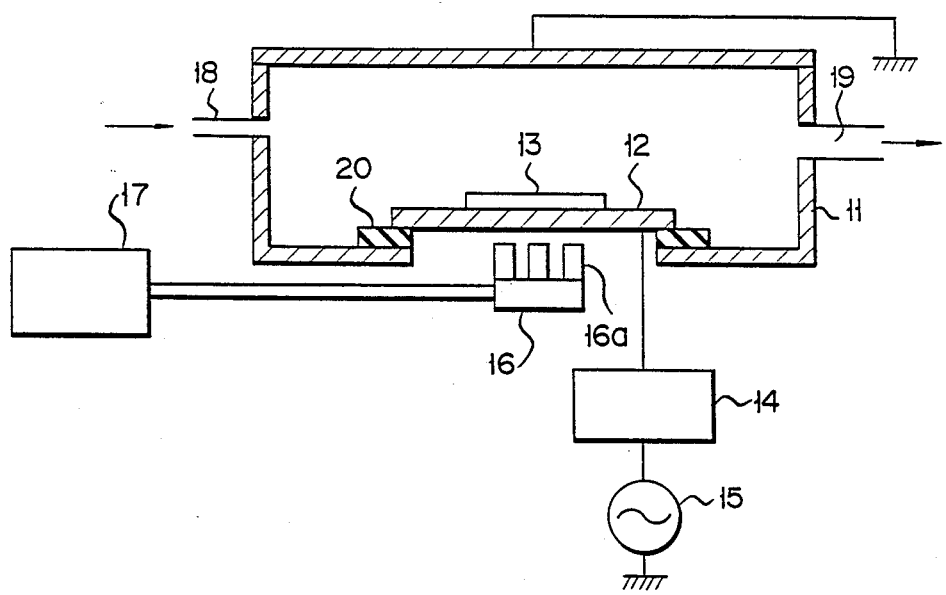
FIG. 1 is a view generally showing a conventional dry etching apparatus.
Figure 2A:
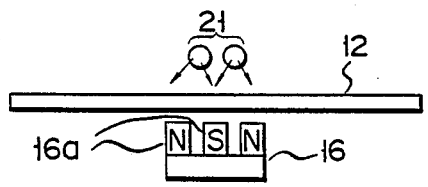
FIGS. 2A to 2C are views for explaining the problem of a dry etching process on the apparatus of FIG. 1.
Figure 2B:
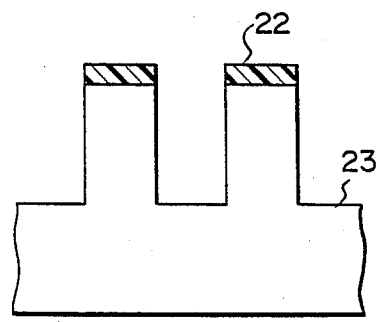
Figure 2C:
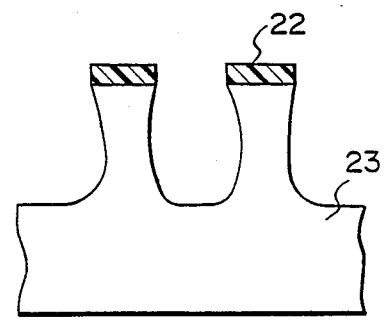

FIG. 6 shows a variation of a pattern profile when the etching rate varies with respect to the etching gas ($Cl_2$) pressure. The Si wafer was etched at an interelectrode distance of 32 [mm] and $Cl_2$ gas flow rate of 20 [cc/min]. As appreciated from FIG. 6 the etching rate reveals peaks at the gas pressure levels of $5 \times 10^{-3}$ and $5 \times 10^{-2}$ torrs. At $5 \times 10^{-3}$ torrs or below, a lower etching rate is involved due to a decrease in the etchnng species (Cl ions). At $5 \times 10^{-3}$ torrs the etching progresses due to a larger amount of ions produced by magnetron discharge. Under this pressure, the mean free path of ions is adequately longer ($\sim 10$ cm) upon comparison with the interelectrode distance d, and the ions in the plasma sheath is vertically incident on the wafer without being scattered. As a result, the etching profile is such that a vertical groove is obtained with a straight side wall formed. With the increasing pressure, the ions are decreased on account of the scattering, resulting in an increase in the proportion of neutral chlorine atoms. At the gas pressure level of $5 \times 10^{-2}$ torrs or above, the etching step progresses with a smaller number of ions and neutral particles mentioned. As the mean free path is naturally shortened, the ions and neutral particles are incident at various angles onto the wafer due to their multiple scatterings. As a result, an undesired side wall cutting, as well as a bottom corner overshoot, occurs at the etched groove on the etching profile. In FIG. 1, reference numeral 51 shows an Si wafer and 52 shows a resist.

It has been found preferable that the gas pressure be on the order of $10^{-3}$ torrs for the fine pattern of a higher aspect ratio to be vertically etched. In order to obtain an adequate etching speed the gas pressure level is preferably $2 \times 10^{-3}$ [torrs] or more. Furthermore, in order to perform a positive vertical etching step without involving any undercutting, the gas pressure level is preferably on the order of $8 \times 10^{-3}$ torrs or below. That is, in order for the fine patterning of a higher aspect ratio to be vertically etched at high speed without involving any undercutting, the gas pressure level is preferably on the order of 2 to $8 \times 10^{-3}$ torrs.

FIG. 7 is a view showing a variation of an etching profile at an etching step when an aluminum film is etched in place of the silicon film, noting that the etching conditions are identical to those in the case of FIG. 6. Even in this case, at the gas pressure level of less than $10^{-2}$ torrs, aluminum film 63 on $SiO_2$ film 62 overlying Si substrate 61 can be vertically etched with resist pattern 64 as a mask at which time no undercutting occurs. At a high pressure level of $10^{-2}$ torrs or more, $Cl_2$ alone in the feed gas brings about undercutting, resulting in the pattern profile having a rough side wall. That is, even if the workpiece is made of aluminum, vertical etching can be made without involving any undercutting, provided that the gas pressure is set at a level of less than $10^{-2}$ torrs, preferably within a range of $2 \times 10^{-4}$ to $8 \times 10^{-3}$ torrs.

In the conventional process, for example, $BCl_3$, $CCl_4$ or chloroform is contained in the feed gas so as to form a protective film at the side wall of the pattern profile. It is, therefore, possible to prevent the formation of the undercutting. However, the problem of a "greater dimensional change" still arises owing to the side wall of the pattern profile having a rough surface and to a film heavily coated at the side surface. According to this invention, the occurrence of "undercutting" is prevented by a very thin film of, for example, a resist decomposition product since the Cl radicals (a cause of "undercutting") become much less. Furthermore, the etching is performed primarily through the utilization of the ions involved, thus obtaining a vertical etching profile with no uneven side surface.

Figure 8:
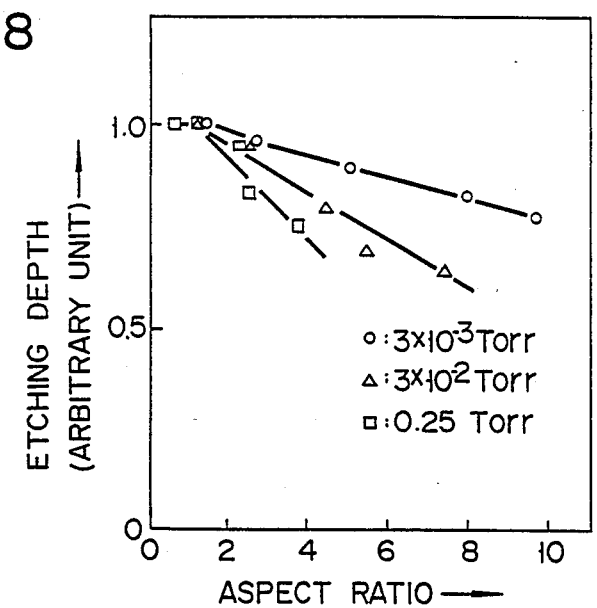
FIG. 8 is a graph showing a variation of an etching depth with respect to an aspect ratio in a process of etching a workpiece in accordance with this invention.

FIG. 8 is a graph showing a variation of the etching depth with respect to the aspect ratio with the pressure as a parameter, noting that the etching depth is standardized with the depth of an adequately wider groove as 1. From this it is seen that the variation of the etching depth with respect to the aspect ratio is decreased with a drop in pressure. This is caused by the longer mean free path of the ions as set out above and the presence of more etching species which are incident onto the wafer. As a result, it is possible to largely reduce the phenomenon that the etching depth varies in the same wafer due to the pattern size.

Figure 9:
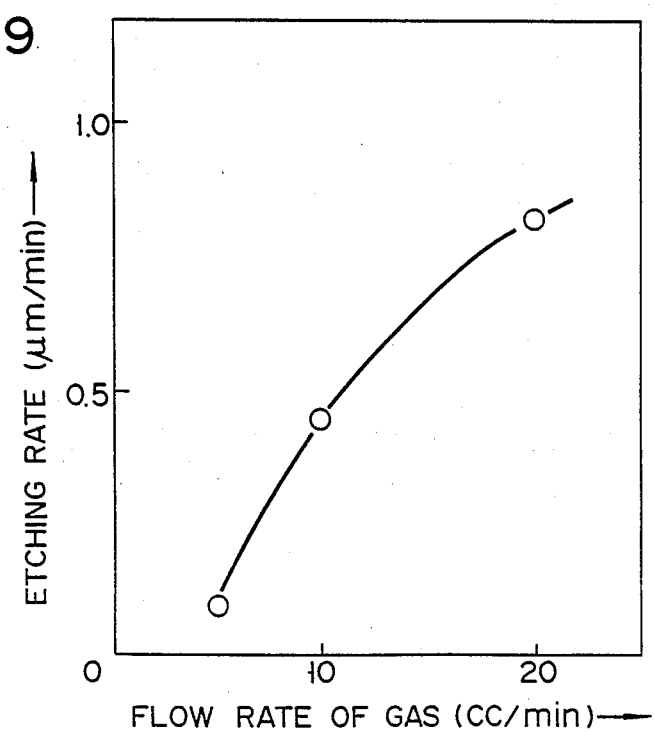
FIG. 9 is a graph showing a variation of the etching rate with respect to a flow rate of an etching gas.

FIG. 9 shows the etching rate of the silicon when the flow rate of $Cl_2$ varies under the same etching conditions. From this it is seen that a flow rate of 10 [cc/min] or more is necessary to obtain a practical etching rate.

According to this invention, a fine groove can be vertically formed at high etching rate without involving any undercutting, by setting the pressure of the $Cl_2$ gas introduced into container 30 on the apparatus of FIG. 3 at a level of $2 \times 10^{-4}$ to $8 \times 10^{-3}$ torrs. As a result, a groove, even if higher in the aspect ratio, can be vertically formed in a better configuration, thus assuring a greater utility with which a semiconductor IC can be manufactured. By covering, for example, a quartz sheet on the surface of second electrode 32, it is possible to prevent electrode 32 from being etched and thus to prevent a possible metal contamination on a substrate to be etched.

Although an explanation has been made as to obtaining the pattern profile of the vertical side wall, a sloped wall etching will now be explained below to obtain a pattern profile of a sloped side wall using a deposition gas together with an etching gas.

Figure 10:
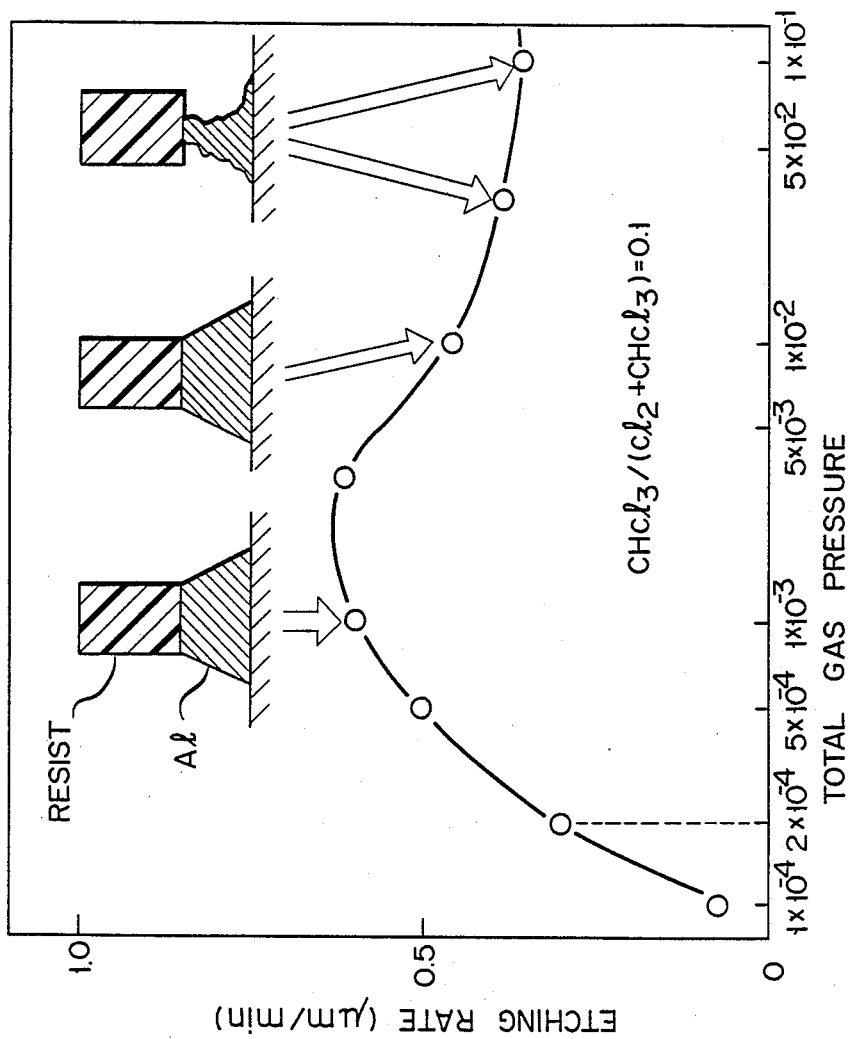
FIG. 10 is a graph showing an etching rate and pattern profile with respect to a total gas pressure when an etching gas and deposition gas are employed as a feed gas.

FIG. 10 shows a variation of the etching rate and etching configuration with respect to total gas pressure when an aluminum film was etched with the use of a gas of chloroform and chlorine with an adding amount of chloroform fixed to 10 Vol. % to obtain a sloped wall etching. At a pressure level of about $10^{-3}$ torrs or below, a pattern profile with a smoothly sloped wall was obtained in which case no deposited film is observed. With a rise in the pressure level, the side wall becomes more and more covered with the deposited film, resulting in a somewhat greater angle of slope there. At $1 \times 10^{-2}$ torrs or above, neutral $Cl_2$ and $Cl$ radicals exist at a higher concentration level, causing undercutting to occur even if the deposition film is heavily formed on the side wall. The obtained pattern is also roughened at the side wall.

On the other hand, at about $10^{-4}$ torrs the etching rate is increased with an increasing pressure level and reaches a peak on the order of $10^{-3}$ torrs and, thereafter, is decreased because the deposition speed becomes greater.

From the above it has been found that, in order to perform a well sloped wall etching, it is better to employ a pressure level of less than $10^{-2}$ torrs at which a deposition film is uniformly formed with less neutral etching species.

It has also been found that an adequate etching rate of above about 0.4 $\mu$m/min. is assured, in particular, within a pressure range of $1 \times 10^{-2}$ to $2 \times 10^{-4}$ torrs.

Figure 11:
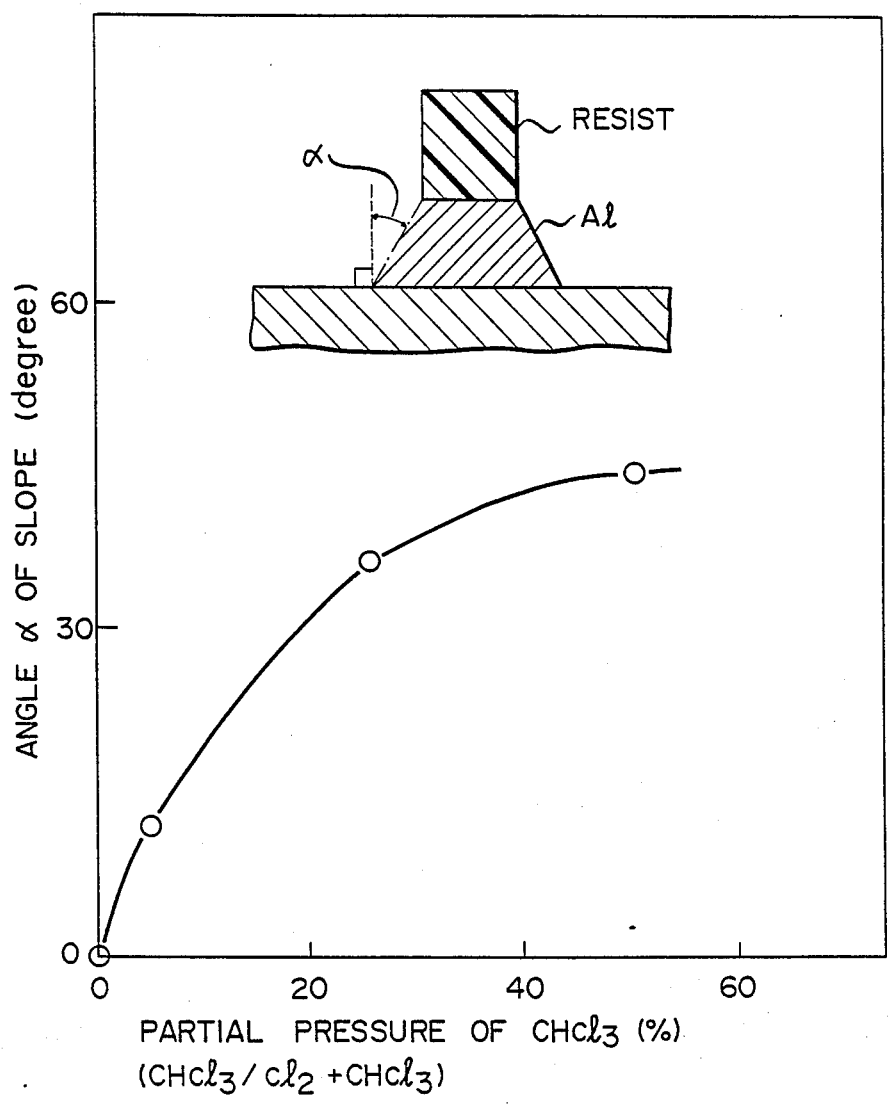
FIG. 11 is a graph showing a variation of an angle of slope on the side wall of a pattern profile and etching rate with respect to an amount of $CHCl_3$ gas added to a $Cl_2$ gas.

FIG. 11 shows a relation of the angle of slope to an added amount of chloroform when an aluminum film is etched on the apparatus of FIG. 3 with the use of a $Cl_2$ and chloroform gas to obtain an angle of slope. In FIG. 11, the abscissa shows a partial pressure of chloroform ($CHCl_3$) in a total gas pressure ($1 \times 10^{-3}$ torrs). The angle of slope is defined to be an angle perpendicular to the sloped surface of the pattern. With an increase in chloroform added, the angle of slope is increased and can be controlled up to about 45°. Even in this case, the deposition film is sputtered at all times by ion irradiation and thus the deposition film is very thin and cannot be observed microscopically. This method is particularly effective with respect to not only the aluminum film but also a material which has so far been difficult to manufacture as a sloped wall.

So providing the sloped wall on the pattern profile facilitates the ease of the deposition of an insulation interlayer, as well as the ease of the planarization of the surface, in the multilayer interconnection technique. Moreover, the side wall, if formed on a polysilicon film, markedly improves the poor conductivity of an upper layer.

Figure 12:
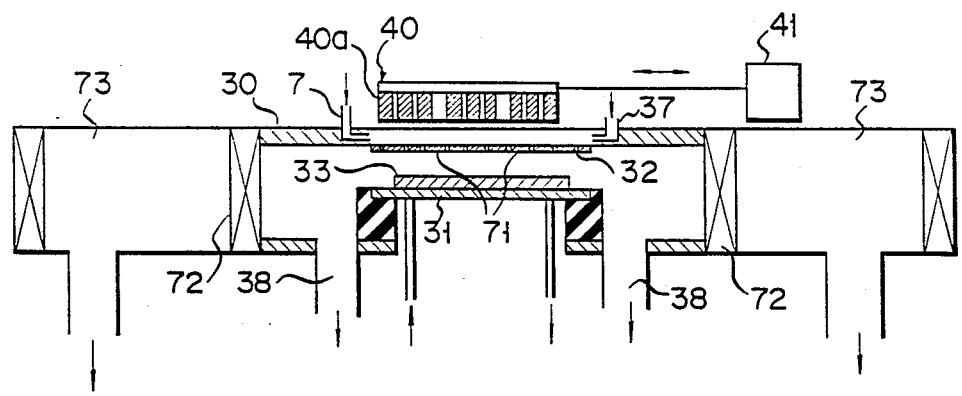
FIGS. 12 and 13 each show a diagrammatic view showing a variant of a drying etching apparatus as used in the process of this invention.
Figure 13:
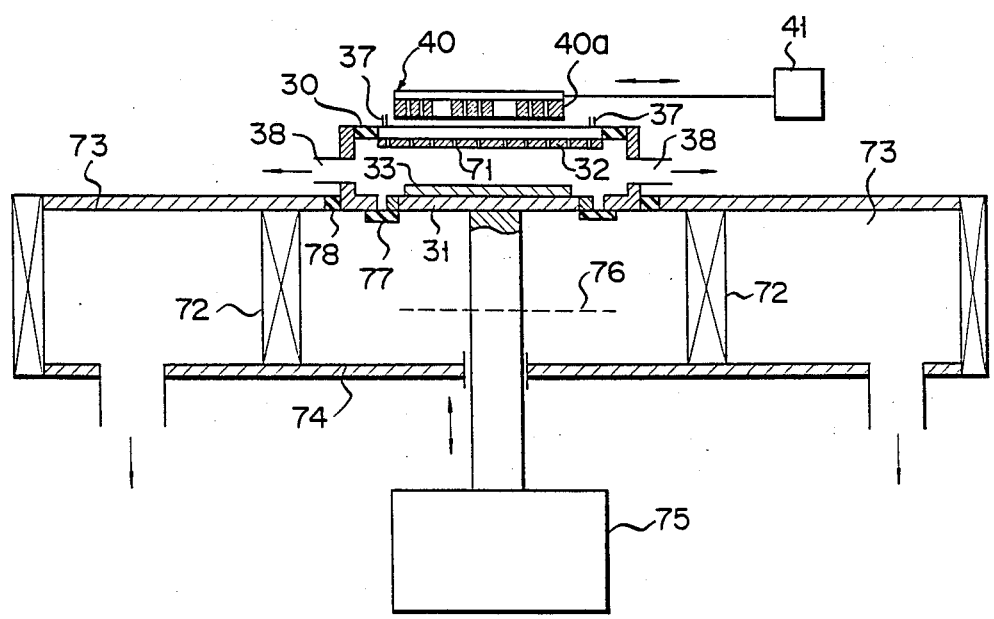

FIGS. 12 and 13, each, are a diagrammatic view showing a variant of the dry etching apparatus in which magnet 40a with a plurality of closed loops is disposed on the same frame for scanning to be effected. In this case, the width of the scanning is set within a range covering the diameter of wafer 33 and within an area of cathode 31. In this arrangement, a high etching rate can be achieved with a high density plasma created on the loop. This scanning system is not of a type that scanning is performed as a reciprocatory movement at the same speed, but of such a type that, when the time quadrature of the magnetic intensity is taken at one point on wafer 33, scanning is performed with an equal integration value obtained at any point on wafer 33 at the time of completing the etching operation. A high uniformity is thus obtained. A gas supplying system is of such a type that a gas introduced through gas inlet 37 into the container is uniformly blown out of many gas blowout holes 71 in electrode 32 which is formed over wafer 33. The evacuation of the gas is performed uniformly around the periphery of the wafer without being affected by the gas stream. In order for the interior of vacuum container 30 to be exposed to the outer atmosphere, a chamber (preparatory chamber) is formed into which a wafer is introduced through gate valve 72. By doing so, an etching disturbing factor, such as the moisture in the outer atmosphere, is prevented from entering vacuum container 30, assuring a stable etching at all times. In order to confine a high density plasma between electrodes 31 and 32, it may be floated with nothing electrically connected thereto or the inner wall of vacuum container 30 may be made of an insulation.

Though not shown, the wall surface of vacuum container 30 is made normally at a predetermined temperature level by water whose temperature is controlled. This means that, in order to perform etching at low pressure, many ions collide with the wall with high energy level, because of the longer mean free path. The temperature of the wall surface is also related to the etching conditions.

FIG. 13 shows the dry etching apparatus where the side wall of vacuum container 30 is electrically floated with the area ratio of the electrode as 1:1 and evacuation outlet 38 is uniformly formed around the outer periphery of vacuum container 30. In the narrow interelectrode system, intermediate chamber 74 is provided between vacuum container 30 and preparatory chamber 73. Here, wafer 33 is placed on electrode 31 by a wafer feeding mechanism, not shown, and electrode 31 is fed by lifting mechanism 75 to a position corresponding to the bottom surface of vacuum container 30 so that etching is performed at that position. In FIG. 13, a "broken line" level 76 shows a position of electrode 31 when the wafer is fed onto that electrode and reference numerals 77 and 78 show an insulation, serving as a vacuum seal, and insulation, respectively.

The dry etching apparatus used in the process of this invention is not restricted to the aforementioned apparatus. For example, the number of permanent magnets for forming the aforementioned magnetic field can properly be varied in accordance with the specification. As a mechanism for moving the magnetic field generator, use may be formed of a loop-like endless belt or chain in which case a high etching rate can be achieved with the movement direction of the magnetic field generator set to one direction and the magnets arraged normally opposite to the second electrode. As a magnetic field applying means use may be made, in place of the permanent magnet and moving mechanism, of an electromagnet whose magnetic field is moved along the second electrode. That is, the stator of a linear motor may be employed as a magnetic field applying means. A variety of changes or modifications can be made within the spirit and scope of this invention.

According to this invention, with the second electrode arranged opposite to the first electrode, the magnetic field generator is located on a side opposite to a side of the second electrode where the second electrode oppositely faces the first electrode. This specific arrangement initially prevents a pattern profile from varying in all directions which has been encountered on the conventional dry etching apparatus.

What is claimed is:

1. A dry etching process, comprising the steps of:
   placing a workpiece with an etching mask formed on the surface thereof, on a first electrode disposed in a container;
   generating a magnetic field of a closed loop on that side of a second electrode disposed in said container which faces said first electrode, so as to extend said magnetic field from said second electrode to said first electrode, and applying a high frequency power across said first and second electrodes;
   supplying a feed gas containing an etching gas into said container; and
   evacuating said container to a set pressure in said container at a level of at least $2\times 10^{-4}$ Torrs and of less than $10^{-2}$ Torrs.

2. The process according to claim 1, wherein said pressure in said container is set at a level of $2\times 10^{-4}$ to $8\times 10^{-3}$ torrs.

3. The process according to claim 2, wherein said pressure in said container is set at a level of $3\times 10^{-3}$ to $8\times 10^{-3}$ torrs.

4. The process according to claim 1, wherein the surface of said workpiece is a material selected from the group consisting of Si, Ge, GaAs, Al, $SiO_2$ and metal silicide.

5. The process according to claim 1, wherein said magnetic field is generated by a permanent magnet which is of a bar type with an alternate array of N and S poles or of a closed loop type with an array of N and S poles, said permanent magnet being movable along said second electrode.

6. The process according to claim 1, wherein said magnetic field is generated by a linear motor stator.

7. The process according to claim 1, wherein a distance between the first and second electrodes is set to be 10 to 100 mm.

8. The process according to claim 1, wherein said second electrode is covered with an insulation at a surface facing said first electrode.

9. The process according to claim 1, wherein said second electrode is made of a material which will not be etched by said feed gas.

10. The process according to claim 1, wherein said feed gas is uniformly blown onto the surface of said workpiece.

11. The process according to claim 1, wherein said feed gas is flowed at a flow rate of above 10 cc/min.

12. The process according to claim 1, wherein said etching gas is a gas containing halogen atoms.

13. The process according to claim 1, wherein said etching gas is selected from the group consisting of $Cl_2$, $F_2$, $CHF_3$ and a mixture of $CH_4$ and $H_2$.

14. The process according to claim 1, wherein said feed gas further contains a deposition gas whereby sloped wall etching is made on said workpiece.

15. The process according to claim 14, wherein said deposition gas is a gas containing carbon and hydrogen atoms or carbon and halogen atoms.

16. The process according to claim 15, wherein said deposition gas is a $CHCl_3$ or a $CHF_3$ gas.

* * * * *